United States Patent
Schneider

(10) Patent No.: US 9,669,714 B2
(45) Date of Patent: Jun. 6, 2017

(54) HIGH VOLTAGE CABLE DETECTION USING ROTATING MACHINE IN HYBRID VEHICLES

(71) Applicant: Allison Transmission, Inc., Indianapolis, IN (US)

(72) Inventor: Eric D. Schneider, Carmel, IN (US)

(73) Assignee: Allison Transmission, Inc., Indianapolis, IN (US)

(*) Notice: Subject to any disclaimer, the term of this patent is extended or adjusted under 35 U.S.C. 154(b) by 227 days.

(21) Appl. No.: 14/447,022

(22) Filed: Jul. 30, 2014

(65) Prior Publication Data

US 2014/0340095 A1  Nov. 20, 2014

Related U.S. Application Data

(63) Continuation of application No. PCT/US2013/026321, filed on Feb. 15, 2013.
(Continued)

(51) Int. Cl.
| | |
|---|---|
| *B60L 3/00* | (2006.01) |
| *B60W 20/00* | (2016.01) |
| *B60W 50/02* | (2012.01) |
| *B60W 20/50* | (2016.01) |
| *G01R 31/00* | (2006.01) |

(Continued)

(52) U.S. Cl.
CPC ............ *B60L 3/0061* (2013.01); *B60L 3/003* (2013.01); *B60W 20/00* (2013.01); *B60W 20/50* (2013.01); *B60W 50/0205* (2013.01); *G01R 31/024* (2013.01); *B60W 2050/021* (2013.01); *G01R 31/006* (2013.01); *G01R 31/026* (2013.01); *G01R 31/083* (2013.01)

(58) Field of Classification Search
CPC ....... G01R 31/024; B60L 3/003; B60W 20/50
USPC ......................................................... 324/511
See application file for complete search history.

(56) References Cited

U.S. PATENT DOCUMENTS

| | | |
|---|---|---|
| 4,634,955 A | 1/1987 | Wada |
| 5,592,093 A | 1/1997 | Klingbiel |

(Continued)

FOREIGN PATENT DOCUMENTS

| | | |
|---|---|---|
| CN | 101526578 A | 9/2009 |
| CN | 101528524 A | 9/2009 |

(Continued)

OTHER PUBLICATIONS

Supplemental European Search Report—EP 13 74 9604—Apr. 6, 2016.

(Continued)

*Primary Examiner* — Christopher Mahoney
(74) *Attorney, Agent, or Firm* — Woodard, Emhardt, Moriarty, McNett & Henry LLP

(57) ABSTRACT

A system and method described herein detects the presence of an unconnected condition in high voltage component cables in an electric or hybrid-electric vehicle having a high voltage battery or energy storage system. The system includes a mechanical motive device, such as a combustion engine, which is used to rotate an electrical machine (E-machine). The rotation of the E-machine induces a sufficient, yet safe, test voltage on the main high voltage cabling of the vehicle. Measurements are taken at various points near the individual high voltage components to determine if a high voltage cable has become disconnected.

21 Claims, 2 Drawing Sheets

Related U.S. Application Data

(60) Provisional application No. 61/600,142, filed on Feb. 17, 2012.

(51) Int. Cl.
  *G01R 31/02* (2006.01)
  *G01R 31/08* (2006.01)

(56) References Cited

U.S. PATENT DOCUMENTS

| | | | |
|---|---|---|---|
| 6,049,139 A | 4/2000 | Nagaura et al. | |
| 6,194,877 B1 | 2/2001 | Judge et al. | |
| 6,462,550 B2 | 10/2002 | Yudahira | |
| 6,464,026 B1* | 10/2002 | Horsley | B60K 6/48 180/65.1 |
| 6,828,798 B2 | 12/2004 | Morimoto | |
| 7,242,196 B2 | 7/2007 | Yudahira et al. | |
| 7,427,865 B2 | 9/2008 | Elder et al. | |
| 7,508,097 B2 | 3/2009 | Furuta et al. | |
| 7,586,722 B2 | 9/2009 | Scholer et al. | |
| 7,589,492 B2* | 9/2009 | Ooishi | B60L 11/1851 320/104 |
| 7,649,360 B2 | 1/2010 | Ivan et al. | |
| 7,688,024 B2 | 3/2010 | Kamaga | |
| 7,746,023 B2 | 6/2010 | Ajima et al. | |
| 7,768,220 B2 | 8/2010 | Schulz et al. | |
| 7,886,857 B2 | 2/2011 | Fujitake | |
| 2001/0019269 A1 | 9/2001 | Yudahira | |
| 2004/0010361 A1* | 1/2004 | Gierer | F16H 61/12 701/62 |
| 2004/0163860 A1* | 8/2004 | Matsuzaki | B60K 6/44 180/65.225 |
| 2004/0195016 A1* | 10/2004 | Shimizu | B60K 6/28 180/65.1 |
| 2005/0266740 A1 | 12/2005 | Kikuchi et al. | |
| 2009/0096463 A1* | 4/2009 | Kanamori | B60K 6/445 324/503 |
| 2009/0228163 A1 | 9/2009 | Tarchinski | |
| 2009/0243554 A1* | 10/2009 | Gu | B60K 6/48 320/162 |
| 2010/0079105 A1 | 4/2010 | Iwanaga et al. | |
| 2010/0109437 A1 | 5/2010 | Fattic | |
| 2011/0015815 A1 | 1/2011 | Bertness | |

FOREIGN PATENT DOCUMENTS

| | | | | |
|---|---|---|---|---|
| DE | 102011100392 A1 * | 11/2012 | | B60L 3/04 |
| DE | 102012220843 A1 * | 5/2014 | | G01R 31/34 |
| JP | 57-016501 A | 1/1982 | | |
| JP | 2011-101590 | 5/2011 | | |
| KR | 10-0857987 B1 | 9/2008 | | |
| KR | 10-0867834 B1 | 11/2008 | | |
| KR | 10-2009-0057138 | 6/2009 | | |
| KR | DE 102011079396 A1 * | 6/2012 | | B60W 10/06 |
| WO | WO 98/30916 | 7/1998 | | |

OTHER PUBLICATIONS

International Search Report and Written Opinion issued in PCT/US2013/021111, dated Jun. 24, 2013.

International Search Report and Written Opinion issued in PCT/US2013/026321, Jun. 3, 2013.

\* cited by examiner

HIGH VOLTAGE CABLE DETECTION USING ROTATING MACHINE IN HYBRID VEHICLES

CROSS REFERENCE TO RELATED APPLICATIONS

This application is a continuation of International Application No. PCT/US2013/026321 filed Feb. 15, 2013, which claims the benefit of U.S. Provisional Patent Application No. 61/600,142 filed Feb. 17, 2012, the entire disclosures of which are hereby incorporated by reference.

BACKGROUND

The present disclosure generally relates to electrical safety and control systems in electric and hybrid electric vehicles. More specifically, the present disclosure relates to a system and method for detecting high voltage cable connections using a rotating machine in vehicles having high voltage energy storage systems.

Modern electric or hybrid electric vehicles containing a high voltage battery or energy storage system (ESS) which provides a portion of the energy required to propel the vehicle will typically contain high voltage cables or bus lines for transferring power from the ESS to various vehicle components. Such components may include, for example, an inverter, motor generator, power converter, etc. The cables may also be used to connect sub-components within the main component assemblies, such as individual energy storage modules within the ESS itself.

The integrity of the high voltage cable connections is of utmost importance to the operation of the vehicle. Any fault, short, or open circuit in the cabling can lead to insufficient power being applied the electric drive components, resulting in poor vehicle performance, loss of mobility, or increased component wear or failure. Problems in the high voltage cabling may also create a severe safety risk for the occupants of the vehicle or technicians attempting to service the vehicle. For example, a cable which is connected to a high voltage source at one end, but disconnected at the other end, may make unintended contact with surrounding vehicle components or surfaces, creating a potential fire or shock hazard.

SUMMARY

According to one aspect of the present disclosure, a method for automatically detecting the presence of a disconnected high voltage cable condition in a hybrid electric vehicle is presented, including: rotating an electrical motor generator at a first speed to produce a test voltage on a high voltage generator cable connecting the motor generator to an inverter in the hybrid electric vehicle, the motor generator mechanically connected to and rotated by a mechanical motive device, the test voltage being less than 50 volts and greater than 14 volts; comparing a first voltage measured at a first terminal of the inverter using a controller to determine whether the generator cable is properly connected between the rotating motor generator and the inverter. The first voltage may be induced across a capacitor in the inverter due to electro motive force (EMF) produced by the motor generator.

According to another aspect, a method for automatically detecting the presence of a disconnected high voltage cable condition in a hybrid electric vehicle is presented, including: rotating an electrical motor generator at a first speed to produce a test voltage on a high voltage generator cable connecting the motor generator to a high voltage component in the hybrid electric vehicle, the motor generator mechanically connected to and rotated by a mechanical motive device, the test voltage being less than 50 volts and greater than 14 volts; comparing a first voltage measured at a first terminal of the inverter using a controller to determine whether the generator cable is properly connected between the motor generator and the inverter.

According to another aspect, a system for detecting high voltage cable connections in a hybrid electric vehicle is presented, including: a mechanical motive device capable of rotating a shaft connected to the mechanical motive device; a rotating electrical motor generator for producing high voltage power, the motor generator connected to the mechanical motive device by the shaft; an inverter, the inverter capable of converting AC power produced by the motor generator into DC power for regenerating a high voltage energy storage system in the vehicle, the inverter also capable of converting DC power produced by the high voltage energy storage system into DC power for powering the electrical generator; a generator cable connecting the motor generator to the inverter; and a controller operatively connected to the mechanical motive device for controlling the speed of the mechanical motive device. The mechanical motive device is operated at a first speed to cause the motor generator to produce an AC voltage on the generator cable. A DC test voltage is induced in the inverter due to the AC voltage on the generator cable, with the DC test voltage being between 14 and 50 volts. The controller compares a first voltage measured at a first terminal of the inverter to determine whether the generator cable is properly connected between the motor generator and the inverter.

According to another aspect, a system for detecting high voltage cable connections in a hybrid electric vehicle is presented, including: a mechanical motive device capable of rotating a shaft connected to the mechanical motive device; a rotating motor generator for supplying power to and receiving power from a first high voltage vehicle component, the motor generator connected to the mechanical motive device by the shaft; a first high voltage cable connecting the energy storage system and the first high voltage vehicle component; and a controller operatively connected to the mechanical motive device for controlling the speed of the mechanical motive device. The mechanical motive device is operated at a first speed to cause the motor generator to produce a test voltage on the first high voltage cable. The controller compares a first voltage measured at a first terminal of the first high voltage vehicle component with the test voltage to determine whether the generator cable is properly connected between the motor generator and the first high voltage vehicle component.

Further forms, objects, features, aspects, benefits, advantages, and embodiments of the present invention will become apparent from a detailed description and drawings provided herewith.

DESCRIPTION OF THE SELECTED EMBODIMENTS

Figure 1:
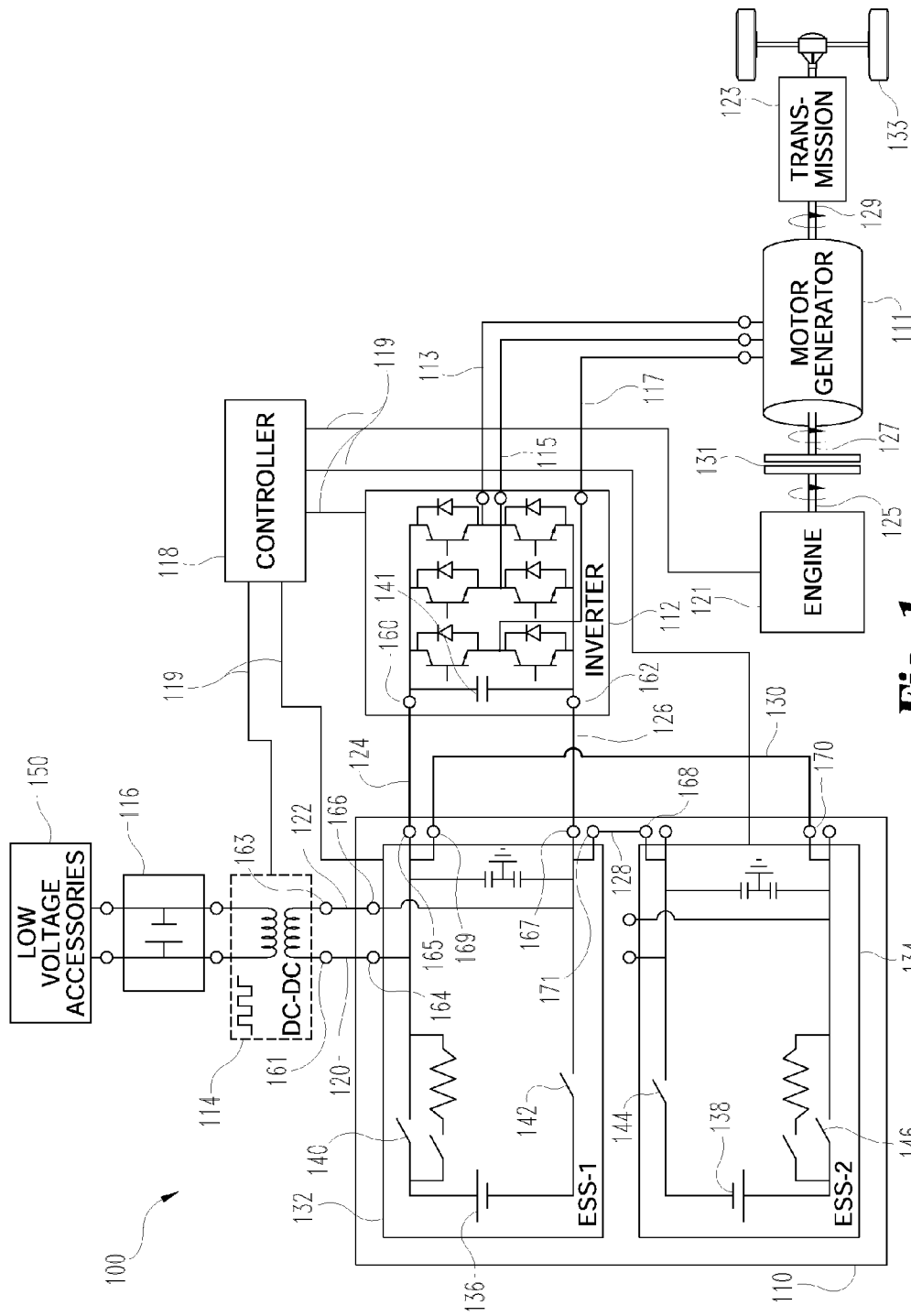
FIG. 1 is a schematic diagram of a system for detecting high voltage cables using a rotating machine in a hybrid vehicle according to one embodiment of the present disclosure.

For the purpose of promoting an understanding of the principles of the invention, reference will now be made to the embodiments illustrated in the drawings, and specific language will be used to describe the same. It will nevertheless be understood that no limitation of the scope of the invention is thereby intended. Any alterations and further modifications in the described embodiments and any further applications of the principles of the invention as described herein are contemplated as would normally occur to one skilled in the art to which the invention relates. One embodiment of the invention is shown in great detail, although it will be apparent to those skilled in the relevant art that some features not relevant to the present invention may not be shown for the sake of clarity.

For the convenience of the reader, it should be initially noted that a drawing in which an element is first introduced is typically indicated by the left-most digit(s) in the corresponding reference number. For example, a component identified with a one-hundred series reference number (e.g., 100, 101, 102, 103, etc.) will usually be first discussed with reference to FIG. 1, and a component identified with a two-hundred series reference number (e.g., 200, 201, 202, 203, etc.) will usually be first discussed with reference to FIG. 2.

FIG. 1 shows a diagrammatic view of a vehicle hybrid drive control system 100 according to one embodiment of the present disclosure. The system and control methods described herein are applicable to any type of electric or hybrid vehicle drive which incorporates a high voltage energy storage system (e.g., a battery) and electric motor for supplying a portion of the power required to propel the vehicle. As shown, the system 100 includes an energy storage system (ESS) 110, an inverter 112, DC-DC converter 114, mechanical motive device 121, electrical machine (E-machine) 111 and controller 118. High voltage converter cables 120 (positive) and 122 (negative) connect terminals 164 and 166 of the ESS 110 to terminals 161 and 163 of the DC-DC converter 114 as shown. High voltage inverter cables 124 (positive) and 126 (negative) connect terminals 165 and 167 of the ESS 110 to terminals 160 and 162 of the inverter 112. High voltage ESS module link cables 128 (negative) and 130 (positive) connect terminals 169 and 171 of the energy storage module 132 to terminals 168 and 170 of the energy storage module 134 within the ESS 110. In the embodiment of FIG. 1, positive terminals 164, 165 and 169 are electrically connected to each other within the ESS 110. Likewise, negative terminals 166, 167 and 171 are electrically connected to each other within the ESS 110.

The inverter 112 may be used to supply AC power to or receive AC power from an E-machine 111 (e.g., a motor generator) via high voltage generator cables 113, 115 and 117. The E-machine 111 may be connected to the vehicle transmission 123 via rotating shaft 129, with transmission 123 providing suitable torque transfer to wheels 133. In the case of a hybrid electric vehicle, the mechanical motive device, such as engine 121, may also be mechanically connected to the E-machine 111 and transmission 123 via clutch 131 and rotating shafts 125 and 127 as shown. The engine 121 is able to provide additional propulsion when the ESS is partially or completely discharged or to run the E-machine 111 in a generator mode to recharge the ESS 110. It shall be understood that additional high voltage cables may be used to connect the ESS 110 to other high voltage vehicle components present in the vehicle or to connect additional high voltage components to each other.

In general operation, the controller 118 interfaces with the various components in FIG. 1 to control the flow of power being supplied by the ESS 110. When power is requested, such as upon initiation of an ignition key-on event, the controller 118 causes the main ESS high voltage contactors 140, 142, 144 and 146 to close, thereby supplying power to the required vehicle components. As will be explained further below, the controller 118 measures the voltage at each of the high voltage components to ensure that the various high voltage power cables are properly connected before allowing the high voltage contactors 140, 142, 144 and 146 to close. In order to provide an accurate measurement, however, a threshold amount of voltage is required. The system 100 provides this voltage by rotating the engine 121, which in turn rotates the E-machine 111. In other embodiments, the E-machine 111 may be initially rotated by a starter or cranking motor connected to the low-voltage battery 116 and/or DC-DC converter 114. In still further embodiments, the E-machine may be rotated by other types of motive devices, such as windmills, treadmills, or solar-powered motors.

As it rotates, the E-machine 111 generates an electromotive force (EMF) which induces an AC voltage in the generator cables 113, 115 and 117. Rotation of the E-machine will also charge the capacitor 141 to a test voltage corresponding to the EMF generated by the E-machine 111 if the ESS contactors 140, 142, 144 and 146 are disconnected (open). The speed of the engine 121 and E-machine 111 are regulated by the controller 118 to keep the test voltage across the capacitor 141 at a level which is suitable for detecting and measuring the connection of the high voltage cables (typically 20 volts), yet is below the threshold required by safety regulations and to prevent injury to operator or service personnel (typically 50 volts). This allows the cable connections to be detected before the main ESS high voltage contactors 140, 142, 144 and 146 are closed and high voltage is applied to the cabling, which is typically in the range of 400 to 450 volts.

ESS 110 preferably comprises multiple energy storage modules 132 and 134 which are connected in parallel to provide sufficient current to the vehicle electrical components during normal operation. Although two energy storage modules are illustrated in FIG. 1, it shall be understood that any number of energy storage modules may be used. Moreover, it is envisioned that the energy storage system 110 can include any system for storing potential energy, such as through chemical means, pneumatic accumulators, hydraulic accumulators, springs, thermal storage systems, flywheels, gravitational devices, and capacitors, to name just a few examples. In one embodiment, the energy storage modules 132 and 134 contain batteries 136 and 138, respectively. The batteries 132 and 134 preferably each comprise a plurality of individual battery cells which are connected in series to achieve the required voltage. In the preferred embodiment, the batteries 132 and 134 operate at a voltage of approximately 420 volts, however other voltages may be used.

Inverter 112 may comprise a DC-AC inverter which converts DC power from the ESS 110 into AC power for driving other downstream high voltage components, such as the E-machine 111. The inverter 112 may also serve to convert alternating current (AC) generated by the E-machine 111 into DC current for charging the batteries 136 and 138 of the ESS 110 when the E-machine 111 is operating as a generator being driven by the engine 121 or the residual inertia of the vehicle (e.g., during regenerative braking or other ESS regeneration modes).

DC-DC converter 114 is connected to the ESS 110 by high voltage cables 120 (positive) and 122 (negative). In one embodiment, the DC-DC converter 114 is a switched-mode buck-boost converter. When operating as a buck converter (i.e., a step-down converter), the DC-DC converter 114 converts the high voltage DC power being supplied by the ESS 110 to a lower DC voltage. The lower voltage is in turn used to charge the low voltage battery 116 and supply DC power to vehicle systems and accessories 150 which require a lower voltage, typically in the range of 12 to 24 volts. When operating as a boost converter, the DC-DC converter 114 transforms low voltage power from the battery 116 to a higher voltage for jumpstarting the vehicle (e.g., if the ESS 110 has become discharged) or for initially rotating the E-machine 111 to create the test voltage as described above. It shall be understood that in addition to a buck-boost converter, DC-DC converter 114 may comprise other types of combination step-up and step-down DC-DC converters.

In a typical embodiment, controller 118 may include a computer having a processor, memory, and input/output connections. It shall be understood that additional elements may be included in the controller 118 as required by the particular application. It shall be further understood that the controller 118 may comprise separate controller modules at each of the high voltage components, a single controller in a common housing, or any combination thereof. The controller 118 may receive additional signals, such as voltage, current, phase, heat, position, speed and/or other variables for the efficient control of the system 100. More specifically, the controller 118 may receive voltage signals which are measured at the high voltage terminals 160 and 162 of inverter 112, terminals 164 and 166 of ESS 110, and terminals 168 and 170 of energy storage module 134 in ESS 110. The controller 118 may also receive signals from other vehicle control subsystems, including vehicle start/stop commands, power and torque change requests, and the like.

It shall be understood that each of the high voltage components 110, 111, 112, and 114 may also contain additional measurement circuitry and/or controllers for measuring or transmitting voltages and other related measurement signals to the controller 118. The controller 118 may receive the measured voltages over control lines 119. Each of the control lines 119 may comprise a direct input conductor or conductor pair carrying the actual voltage being measured or a data format medium which uses a communication protocol or data bus to transmit the voltage measurement value from the relevant high voltage component to the controller. Still other arrangements or circuitry known in the art may be used to transmit the measured voltages to the controller 118.

Figure 2:
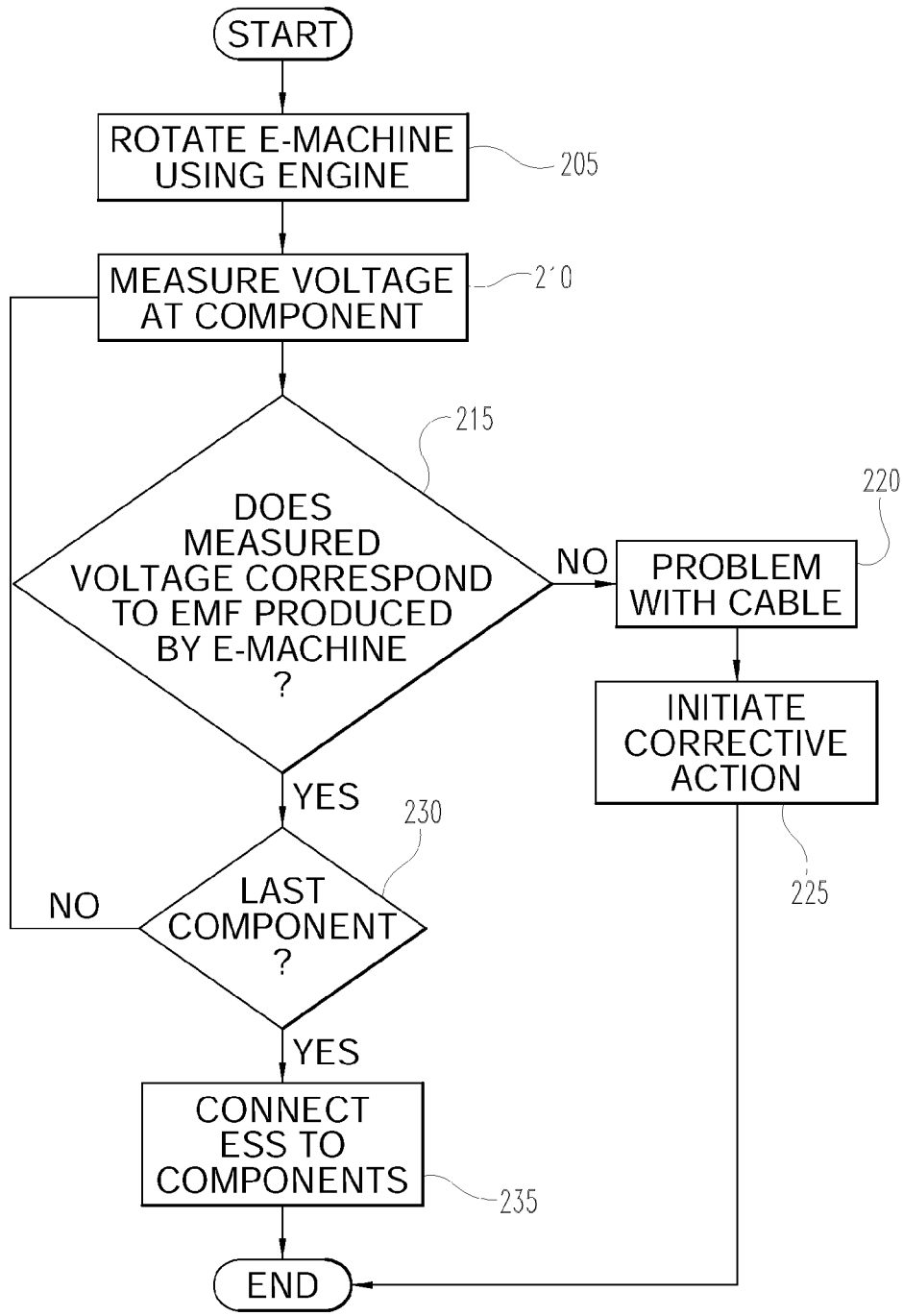
FIG. 2 is a diagram which illustrates the stages involved in detecting high voltage cables in a hybrid vehicle using the system of FIG. 1 according to one embodiment.

FIG. 2 illustrates a method for detecting the connection of high voltage cables in the system 100. The process starts at step 205 when the controller 118 directs the engine 121 (or other motive device) to rotate the E-machine 111 at speed which will cause a corresponding test voltage of 15 to 50 volts to be induced across the DC-side terminals 160 and 162 of the inverter 112. The cited range provides sufficient voltage to allow an accurate measurement, yet is below the threshold typically required for safety regulations.

Once the E-machine 111 has reached the required speed, the process proceeds to step 210 where the controller 118 evaluates a voltage signal measured across the terminals 160 and 162. The voltage signal may be measured by appropriate measurement circuitry within the inverter 112 and transmitted to the controller 118. If the measured signal corresponds to an expected value based on the EMF being generated by the E-machine 111 (decision block 215), accounting for typical cable voltage drop, then the generator cables 113, 115 and 117 are assumed to be properly connected. If the measured voltage is too low, the controller assumes that one of the cables has become disconnected or its integrity has otherwise been compromised (step 220). The controller 118 then takes appropriate corrective measures to prevent an electrical safety hazard, such as preventing the ESS contacts from closing, running the vehicle on engine power only, or immobilizing the vehicle (step 225).

If the voltage measured at step 215 is determined to be sufficient, the process moves to decision block 230 to determine whether additional high voltage component cables should be evaluated. With respect to the illustrated system 100, the process returns to step 210 and measures the voltage across terminals 165 and 167 of the energy storage module 132 of ESS 110. If the measured voltage matches the expected value as described above, the controller determines that the inverter cables 124 and 126 are properly connected. If the voltage is too low, the controller 118 again assumes that at least one of the cable connections has been compromised and the process proceeds to step 220 and 225 where appropriate action is taken by the controller 118 to prevent an electrical safety hazard.

The process repeats steps 210 and 215 once more by measuring the voltage across terminals 165 and 167 at the DC-DC converter 114 to detect the connection status of high voltage converter cables 120 and 122. The process steps 210 and 215 may be repeated again by measuring the voltage across terminals 168 and 170 at the energy storage module 134 to detect the connection status of high-voltage module link cables 128 and 130. It shall be understood that additional high voltage cables may be evaluated or detected in a similar fashion, with the controller progressively evaluating the cable connections further downstream of the previously evaluated cable section. If the previously evaluated upstream termination voltage is determined to be adequate, but the voltage at the terminals being currently evaluated is below a predetermined threshold, it can be assumed that there is a problem with cable section from the previously measured termination point to the currently measured termination point.

It shall be understood that instead of stopping the vehicle start-up sequence at step 225, the start-up sequence may be allowed to continue, depending on the measured voltage or other considerations regarding the cable being detected. For example, if the cable being evaluated is determined to be only partially disconnected or compromised due to minor corrosion, the controller 118 may simply alert the driver that the condition should be addressed at the next service appointment, while still allowing the vehicle to be driven.

If all of the high voltage cable connections have been verified (decision block 235), the controller allows the contacts 140, 142, 144 and 146 of the ESS to close, thereby supplying high voltage power to the various components (step 235).

As used in the specification and claims, the words "cable" and "cabling" shall be interpreted to mean any electrical conductor which connects to and provides a conductive path between two electrical components, such as insulated wire conductors, multi-conductor jacketed cabling, electrical bus bars, and the like. Furthermore, it shall be understood that the particular arrangement of high voltage cables shown in FIG. 1 is meant for illustrative purposes only, and additional arrangements and combinations of high voltage cabling and components are contemplated to be within the scope of the present disclosure. For example, while the high voltage cabling is shown in FIG. 1 as having dedicated ground conductors (122, 126, and 128) for each positive conductor (120, 124 and 130, respectively), the system 100 may also utilize a common ground arrangement, with the ground conductors tied to a common ground point, such as a main vehicle chassis ground.

As used in the specification and claims, the words "low voltage" shall be interpreted to mean voltages equal to or less than fifty volts.

As used in the specification and claims, the words "high voltage" shall be interpreted to mean voltages greater than fifty volts which are dangerous for human contact.

While the invention has been illustrated and described in detail in the drawings and foregoing description, the same is to be considered as illustrative and not restrictive in character, it being understood that only the preferred embodiment has been shown and described and that all changes, equivalents, and modifications that come within the spirit of the inventions defined by following claims are desired to be protected. All publications, patents, and patent applications cited in this specification are herein incorporated by reference as if each individual publication, patent, or patent application were specifically and individually indicated to be incorporated by reference and set forth in its entirety herein.

The invention claimed is:

1. A method for automatically detecting the presence of a disconnected high voltage cable condition in a hybrid electric vehicle, comprising:
    using a controller, rotating an electrical motor generator at a first speed to produce a test voltage provided to an inverter on a high voltage generator cable connecting the motor generator to the inverter in the hybrid electric vehicle, said motor generator mechanically connected to and rotated by a mechanical motive device, said test voltage being less than 50 volts and greater than 14 volts; and
    using the controller, automatically comparing an inverter voltage measured at an inverter terminal of the inverter with the test voltage to determine whether the generator cable is properly connected between the rotating motor generator and the inverter.

2. The method according to claim 1,
    wherein said inverter voltage is induced across a capacitor in said inverter due to EMF produced by the motor generator.

3. The method according to claim 1,
    wherein the mechanical motive device is an internal combustion engine.

4. The method according to claim 1, further comprising:
    using the controller, automatically comparing an energy storage system voltage measured at an energy storage system terminal of a high voltage energy storage system in the vehicle with the test voltage to determine whether an inverter cable is properly connected between the inverter and the energy storage system.

5. The method according to claim 1, further comprising:
    using the controller, automatically comparing a converter voltage measured at a converter terminal of a DC-DC converter with the test voltage to determine whether a converter cable is properly connected between the energy storage system and the DC-DC converter.

6. The method according to claim 1, further comprising:
    using the controller, automatically comparing a first module voltage measured at a first module terminal of a first energy storage module within the energy storage system with the test voltage to determine whether a module link cable is properly connected between the first energy storage module and a second energy storage module within the energy storage system.

7. The method according to claim 1,
    wherein said comparing is performed by the controller in response to a request to initiate a vehicle start-up sequence.

8. The method according to claim 1,
    wherein the controller causes the vehicle to be immobilized if at least one of the generator, inverter, converter, and module link cables is not determined to be properly connected.

9. The method according to claim 1, further comprising:
    using the controller, automatically preventing the energy storage system from supplying high voltage power to at least one of the inverter and DC-DC converter by maintaining a high voltage contact switch of the energy storage system in an open position if at least one of the generator, inverter, converter, and module link cables is not properly connected.

10. A method for automatically detecting the presence of a disconnected high voltage cable condition in a hybrid electric vehicle, comprising:
    rotating an electrical motor generator at a first speed to produce a first test voltage delivered on a generator cable to a first high voltage component, and a second test voltage delivered on an additional high voltage cable from the first high voltage component to a second high voltage component of the hybrid vehicle, said motor generator mechanically connected to and rotated by a mechanical motive device, said test first and second test voltage being less than 50 volts and greater than 14 volts; and
    comparing a first component voltage measured at a first terminal of the first high voltage component with the test voltage using a controller to determine whether the generator cable is properly connected between the motor generator and the first high voltage component, and
    comparing a second component voltage at a first terminal of the second high voltage component using a controller to determine whether the additional high voltage cable is properly connected between the first high voltage component and the second high voltage component.

11. A system for detecting high voltage cable connections in a hybrid electric vehicle, comprising:
    a mechanical motive device capable of rotating a shaft connected to the mechanical motive device;
    a rotating electrical motor generator for producing high voltage power, said motor generator connected to the mechanical motive device by said shaft;
    an inverter, said inverter capable of converting AC power produced by the motor generator into DC power for regenerating a high voltage energy storage system in the vehicle, said inverter also capable of converting DC power produced by the high voltage energy storage system into DC power for powering the motor generator;
    a high voltage generator cable connecting the motor generator to a first AC terminal of the inverter; and
    a controller operatively connected to the mechanical motive device for controlling the speed of the mechanical motive device;

wherein the controller operates the mechanical motive device at a first speed to cause the motor generator to produce an output AC voltage on the high voltage generator cable;

wherein the inverter is configured to generate a test voltage on a DC side of the inverter using the output AC voltage on the generator cable, said test voltage being between 14 and 50 volts; and wherein the controller automatically compares the test voltage with the output AC voltage on the generator cable to determine whether the generator cable is properly connected between the motor generator and the inverter.

12. The system according to claim 11, further comprising:
an inverter cable connecting the inverter and the energy storage system, wherein the controller automatically compares an energy storage system voltage measured at an energy storage system terminal of the energy storage system with the test voltage to determine whether the inverter cable is properly connected between the energy storage system and the inverter.

13. The system according to claim 11, further comprising:
a converter cable connecting the energy storage system and a high side of the DC-DC converter, wherein the controller automatically compares a converter voltage measured at a third terminal of the DC-DC converter to determine whether the converter cable is properly connected between the energy storage system and the DC-DC converter.

14. The system according to claim 11,
wherein the energy storage system comprises a plurality of energy storage modules, a first one and a second one of the energy storage modules connected together by a high voltage module link cable, said first one of said energy storage modules also connected to said converter cable; and wherein the controller compares a module voltage measured at a module terminal of the second energy storage module to determine whether the high voltage module link cable is properly connected between the first energy storage module and the second energy storage module.

15. The system according to claim 11,
wherein the energy storage system comprises at least one high voltage contact switch for electrically isolating the energy storage system from the inverter.

16. The system according to claim 15,
wherein the controller maintains the high voltage contact switch in an open position if at least one of the generator cable, inverter cable, converter cable and module link cable is not properly connected.

17. The system according to claim 11,
wherein the inverter further comprises a capacitor connected to the DC side of the inverter; and
wherein the first voltage is measured across the capacitor.

18. The system according to claim 11,
wherein the mechanical motive device is an internal combustion engine.

19. A system for detecting high voltage cable connections in a hybrid electric vehicle, comprising:
a mechanical motive device capable of rotating a shaft connected to the mechanical motive device;
a rotating motor generator for supplying power to a first high voltage vehicle component, said motor generator connected to the mechanical motive device by said shaft;
a first high voltage cable connecting a first high voltage vehicle component to a second high voltage vehicle component; and
a controller operatively connected to the mechanical motive device for automatically controlling the speed of the mechanical motive device;
wherein the mechanical motive device is operated at a first speed to cause the motor generator to produce a test voltage on the first high voltage cable; and
wherein the controller automatically compares a component voltage measured at a terminal of at least one of the first and second high voltage vehicle components with the test voltage to determine whether the first high voltage cable is properly connected between the first and second high voltage vehicle components.

20. The system according to claim 19,
wherein the first high voltage component comprises an inverter.

21. The system according to claim 19,
wherein the mechanical motive device comprises an internal combustion engine.

* * * * *